United States Patent
Yang et al.

(10) Patent No.: US 9,831,089 B2
(45) Date of Patent: Nov. 28, 2017

(54) METHOD FOR ADJUSTING EFFECTIVE WORK FUNCTION OF METAL GATE

(71) Applicant: INSTITUTE OF MICROELECTRONICS, CHINESE ACADEMY OF SCIENCES, Beijing (CN)

(72) Inventors: Hong Yang, Beijing (CN); Wenwu Wang, Beijing (CN); Jiang Yan, Beijing (CN); Weichun Luo, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 72 days.

(21) Appl. No.: 14/407,210

(22) PCT Filed: Aug. 30, 2013

(86) PCT No.: PCT/CN2013/082661
§ 371 (c)(1),
(2) Date: Dec. 11, 2014

(87) PCT Pub. No.: WO2015/014004
PCT Pub. Date: Feb. 5, 2015

(65) Prior Publication Data
US 2016/0240382 A1    Aug. 18, 2016

(30) Foreign Application Priority Data

Aug. 1, 2013 (CN) .......................... 2013 1 0331607

(51) Int. Cl.
*H01L 21/28* (2006.01)
*H01L 21/8238* (2006.01)
(Continued)

(52) U.S. Cl.
CPC ...... *H01L 21/28088* (2013.01); *H01L 21/321* (2013.01); *H01L 21/823842* (2013.01); *H01L 29/517* (2013.01); *H01L 29/66545* (2013.01)

(58) Field of Classification Search
CPC ......... H01L 21/823842; H01L 29/4966; H01L 21/28088; H01L 29/517; H01L 29/66545; (Continued)

(56) References Cited

U.S. PATENT DOCUMENTS

| 6,383,879 B1 | 5/2002 | Kizilyalli et al. |
| 2006/0115940 A1 | 6/2006 | Kim et al. |

(Continued)

FOREIGN PATENT DOCUMENTS

| CN | 1266277 A | 9/2000 |
| CN | 1812054 A | 8/2006 |

(Continued)

*Primary Examiner* — Jaehwan Oh
(74) *Attorney, Agent, or Firm* — Christensen, Fonder, Dardi & Herbert PLLC

(57) ABSTRACT

A method for adjusting an effective work function of a metal gate. The method includes forming a metal gate arrangement comprising at least a metal work function layer, and performing plasma treatment on at least one layer in the metal gate arrangement. In this way, it is possible to adjust the effective work function of the metal gate in a relatively flexible way.

9 Claims, 5 Drawing Sheets

(51) Int. Cl.
*H01L 21/321* (2006.01)
*H01L 29/51* (2006.01)
*H01L 29/66* (2006.01)

(58) Field of Classification Search
CPC ....... H01L 27/092; H01L 29/49; H01L 29/51; H01L 21/823857; H01L 21/28185
See application file for complete search history.

(56) References Cited

U.S. PATENT DOCUMENTS

| | | | |
|---|---|---|---|
| 2008/0146012 A1 | 6/2008 | Lin et al. | |
| 2008/0188044 A1 | 8/2008 | Hsu et al. | |
| 2010/0038721 A1* | 2/2010 | Lin | H01L 21/28088 257/369 |
| 2010/0052067 A1* | 3/2010 | Hsu | H01L 21/823842 257/369 |
| 2013/0045594 A1* | 2/2013 | Wang | H01L 21/823842 438/589 |
| 2013/0049141 A1* | 2/2013 | Cheng | H01L 29/4966 257/412 |
| 2014/0110790 A1* | 4/2014 | Huang | H01L 21/823842 257/369 |
| 2015/0004780 A1* | 1/2015 | Cheng | H01L 29/4966 438/592 |

FOREIGN PATENT DOCUMENTS

| | | |
|---|---|---|
| CN | 101128922 B | 2/2008 |
| CN | 102549755 A | 7/2012 |
| CN | 102956460 A | 3/2013 |

* cited by examiner

METHOD FOR ADJUSTING EFFECTIVE WORK FUNCTION OF METAL GATE

CROSS-REFERENCE TO RELATED APPLICATION(S)

This application is a U.S. national phase of PCT Application No. PCT/CN2013/082661, entitled "METHOD FOR ADJUSTING EFFECTIVE WORK FUNCTION OF METAL GATE," filed on Aug. 30, 2013, which claims priority to Chinese Application No. 201310331607.3, filed on Aug. 1, 2013. Both the PCT Application and the Chinese Application are incorporated herein by reference in their entireties.

FIELD OF THE INVENTION

The present disclosure relates to the field of semiconductors, in particular, to a method for adjusting an effective work function of a metal gate.

BACKGROUND

As the feature size of transistors in large scale integrated circuits becomes smaller continuously, a conventional gate arrangement of silicon dioxide/poly silicon is being replaced with a high dielectric constant (High-K) gate dielectric/Metal gate arrangement gradually. To meet the multi-threshold requirement for devices, a dual-metal-gate design is typically utilized. In other words, metallic materials with different work functions are used for an NMOSFET and a PMOSFET, so that effective work functions of their metal gates approximate the conduction band edge (~4.2 eV) and the valence band edge (~5.1 eV) of a silicon substrate, respectively.

It is desired to adjust an effective work function of a metal gate more efficiently. Especially in the gate-last process, there are problems, such as, filling of the high-K gate dielectric/metal gate arrangement and limited options for metal gate materials. It is important but difficult in the high-K dielectric/Metal gate engineering to adjust the effective work function of the metal gate.

SUMMARY

The present disclosure aims to provide, among others, a method for adjusting an effective work function of a metal gate.

According to an aspect of the present disclosure, a method for adjusting an effective work function of a metal gate is provided. This method may comprise forming a metal gate arrangement comprising at least a metal work function layer, and performing plasma treatment on at least one layer in the metal gate arrangement.

This method may further comprise selecting conditions for the plasma treatment to achieve a desired effective work function. The conditions for the plasma treatment may comprise one or more of plasma power, plasma treatment duration, plasma treatment atmosphere, or plasma treatment pressure. For example, the plasma power may be about 10 W to about 1000 W, the plasma treatment duration may be about 1 second to about 30 minutes, the plasma treatment atmosphere may comprise $N_2$:$H_2$ at a ratio of about 1:50 to about 50:1, and the plasma treatment pressure may be about 1 torr to 100 torr.

Furthermore, the metal gate arrangement may further comprise one or more of a capping layer, an etch stop layer, a barrier layer, or a scavenging layer. In this case, performing the plasma treatment on the metal gate arrangement may comprise performing the plasma treatment on any one or more layers in the metal gate arrangement.

The metal gate arrangement may be formed on a gate dielectric layer disposed on the substrate, and the gate dielectric layer may comprise a high-K material. There may be an interface layer between the gate dielectric layer and the substrate.

Furthermore, a plurality of the metal gate arrangements may be formed. In this case, this method may further comprise performing the plasma treatment on some of the plurality of the metal gate arrangements, but without performing the plasma treatment on rest of the plurality of the metal gate arrangements.

According to embodiments of the present disclosure, the plasma treatment may be performed on any one or more layers in a monolayer or multilayer metal gate arrangement to adjust an effective work function of the metal gate arrangement efficiently, and thus to achieve different threshold adjustments for semiconductor devices.

BRIEF DESCRIPTION OF THE DRAWINGS

The above and other objects, features, and advantages of the present disclosure will become more apparent from following descriptions on embodiments thereof with reference to attached drawings, in which.

Throughout the drawings, like reference numerals may denote like parts.

DETAILED DESCRIPTION

Figure 1:
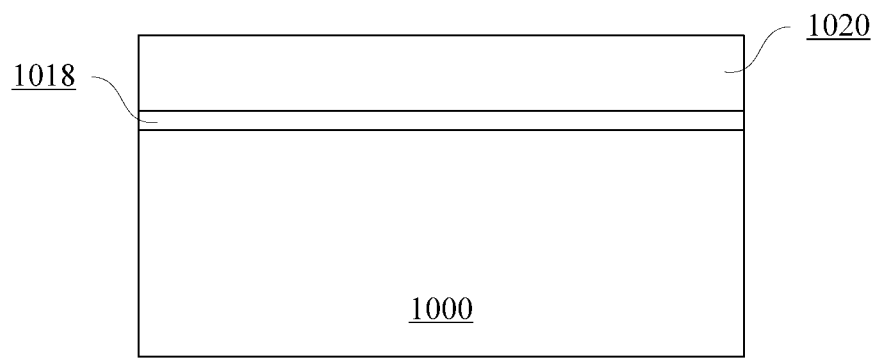
FIGS. 1-6 are simplified views schematically showing a method according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, a method for adjusting an effective work function of a metal gate is provided. In particular, plasma treatment may be performed on any one or more layers in a metal gate arrangement. By changing one or more conditions for the plasma treatment, such as, plasma power, plasma treatment duration, plasma treatment atmosphere, or plasma treatment pressure, it is possible to adjust the effective work function of the metal gate in an efficient way.

According to an embodiment of the present disclosure, the metal gate arrangement may comprise at least a metal work function layer, and optionally other additional layer(s), such as, one or more of a capping layer, an etch stop layer, a barrier layer, or a scavenging layer. The additional layer(s) may be advantageous in the CMOS integration process. After formation of any one or more layers in the metal gate arrangement (for example, by deposition), plasma may be applied to the layer(s), and thereby the layer(s) is subjected to the plasma treatment. Such plasma treatment will cause the effective work function exhibited by the metal gate arrangement as a whole to be adjusted. In a case where the plasma treatment is performed on multiple layers in the metal gate arrangement, the plasma may be applied to each of the multiple layers after this layer is formed, or the plasma may be applied to some or all of the multiple layers altogether after they are formed.

In manufacturing an integrated circuit, the plasma treatment may be performed on metal gate arrangements of some devices, but not on metal gate arrangements of other devices. In the devices on which the plasma treatment is performed, different conditions for the plasma treatment may be selected. In this way, it is possible to achieve different threshold adjustments of the devices.

The technology disclosed herein may be presented in various ways, some of which will be described in the following by way of example.

As shown in FIG. 1, a substrate 1000 is provided. The substrate 1000 may comprise any suitable forms of substrates, for example, a bulk semiconductor substrate such as Si and Ge, a compound semiconductor substrate such as SiGe, GaAs, GaSb, AlAs, InAs, InP, GaN, SiC, InGaAs, InSb, and InGaSb, a Semiconductor on Isolator (SOI) substrate, or the like. Here, a bulk silicon substrate and silicon system materials are described by way of example. However, it should be noted that the present disclosure is not limited thereto.

On the substrate 1000, a sacrificial gate dielectric layer 1018 and a sacrificial gate conductor layer 1020 may be formed in sequence by, for example, deposition. The sacrificial gate dielectric layer 1018 may comprise oxide (for example, $SiO_2$), and the sacrificial gate conductor layer 1020 may comprise polycrystalline silicon.

Figure 2:
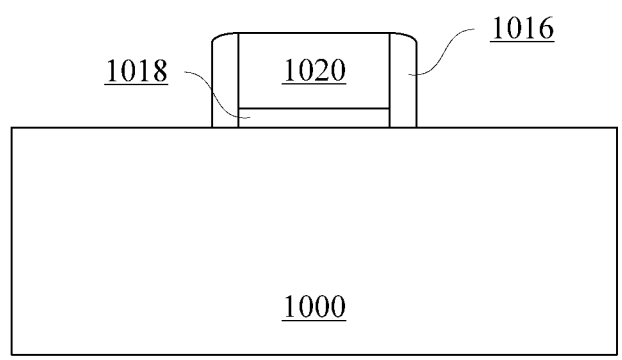

Then, as shown in FIG. 2, the sacrificial gate dielectric layer 1018 and the sacrificial gate conductor layer 1020 may be patterned into a sacrificial gate stack by, for example, photolithography. Halo and extension implantation may be performed with the sacrificial gate stack as a mask. After that, a spacer 1016 may be formed on side walls of the gate stack. For example, the spacer 1016 may be formed by conformally depositing a layer of nitride (for example, silicon nitride) onto the substrate, and then performing selective etching, for example, Reactive Ion Etching (RIE), on this layer of nitride. Subsequently, source/drain implantation may be performed with the gate stack and the spacer 1016 as a mask. Furthermore, annealing may be performed to activate implanted ions, and thus source/drain regions can be formed.

Figure 3:
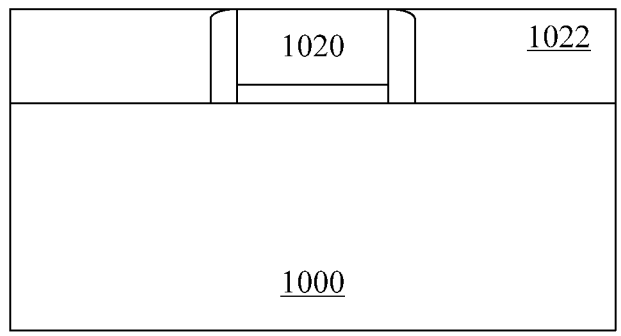

Next, as shown in FIG. 3, an interlayer dielectric layer 1022 may be formed on the structure shown in FIG. 2. For example, the interlayer dielectric layer 1022 may be formed by depositing oxide and then performing planarization, for example, Chemical Mechanical Polishing (CMP), thereon. The planarization may stop at the spacer 1016, to expose the sacrificial gate stack.

Figure 4:
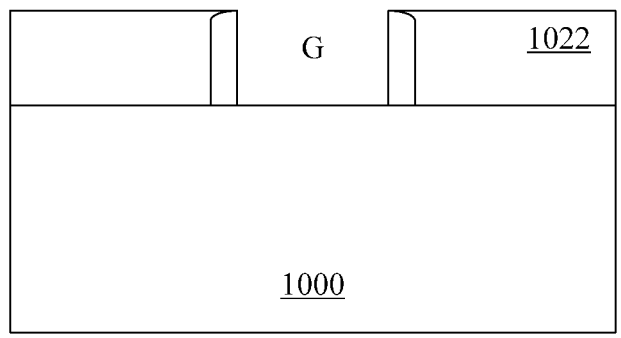

Next, as shown in FIG. 4, the sacrificial gate stack (in particular, the sacrificial conductor layer 1020 and the sacrificial gate dielectric layer 1018) may be removed by selective etching (for example, wet etching). In this way, a gate trench G is left inside the spacer 1016 in the interlayer dielectric layer 1022.

After that, a real gate stack may be formed in the gate trench G.

Figure 5:
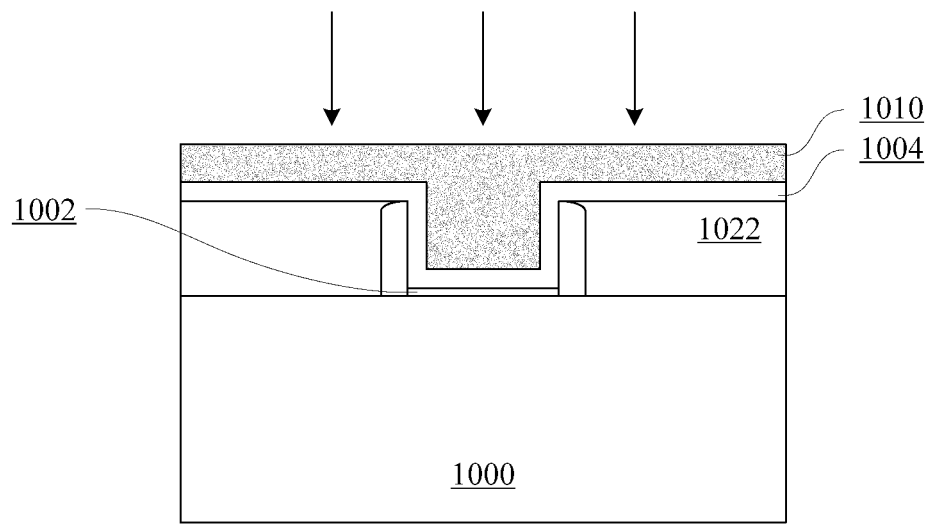

Specifically, as shown in FIG. 5, a high-K gate dielectric layer 1004 and a metal gate arrangement may be formed in sequence on the structure shown in FIG. 4 by, for example, deposition. In this example, the metal gate arrangement comprises a metal work function layer 1010. For example, the high-K gate dielectric layer 1004 may comprise $HfO_2$ or the like, with a thickness of about 10-40 Å. The metal work function layer 1010 may comprise TiAl, TiN, or the like, with a thickness of about 0.5-10 nm. Furthermore, the metal work function layer 1010 is not limited to a single layer configuration as shown in the figure, but it may also comprise a stack of multiple metal work function materials.

In the example shown in FIG. 5, the gate trench G is shown to be filled up by the high-K gate dielectric layer 1004 and the metal work function layer 1010. However, the present disclosure is not limited thereto. For example, the metal work function layer 1010 may be formed to be thinner, such that the gate trench G is not filled up. After that, a layer of polycrystalline silicon or metal may be further formed on the metal work function layer 1010 by, for example, deposition.

In an example, an interface layer 1002 may be formed on a surface of the substrate 1000 by, for example, deposition or thermal oxidation. The interface layer 1002 may comprise oxide (for example, silicon oxide), with a thickness of about 5 Å-2 nm. In the example shown in FIG. 5, the interface layer 1002 may be formed by thermal oxidation, and thereby it is located on the bottom of the gate trench G.

After the metal gate arrangement (in this example, the metal work function layer 1010) is formed, plasma treatment may be performed on the metal gate arrangement, as shown by arrows in FIG. 5. In an example, conditions for the plasma treatment, such as, plasma power, plasma treatment duration, plasma treatment atmosphere, and plasma treatment pressure, may be selected. Here, for example, a plasma power of about 10 W to about 1000 W, a plasma treatment duration of about 1 second to about 30 minutes, a plasma treatment atmosphere of $N_2:H_2$ at a ratio of about 1:50 to about 50:1, and a plasma treatment gas pressure of about 1 torr to 100 torr may be selected. One skilled in the art may appropriately adjust one or more of the conditions based on actual needs to achieve a desired effective work function.

Figure 6:
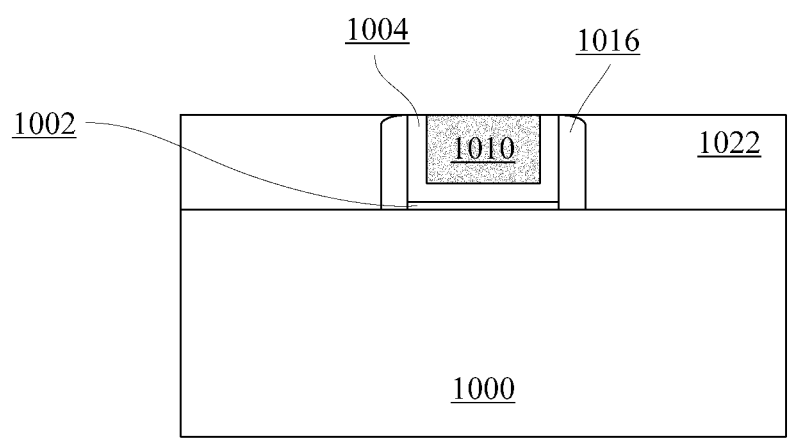

Next, as shown in FIG. 6, portions of the high-K gate dielectric layer 1004 and the metal gate arrangement outside the gate trench G are removed by, for example, being etched back, and thereby a gate stack is formed. During the etching back, the spacer may serve as a stop point.

Here, it is to be noted that the above descriptions are given with reference to the gate-last process. However, the present disclosure is not limited thereto, but is also applicable to the gate-first process. Furthermore, in the above descriptions, processes and parameters of the gate-last process per se are not described in detail. One skilled in the art may contemplate various proper processes and parameters.

Figure 7:
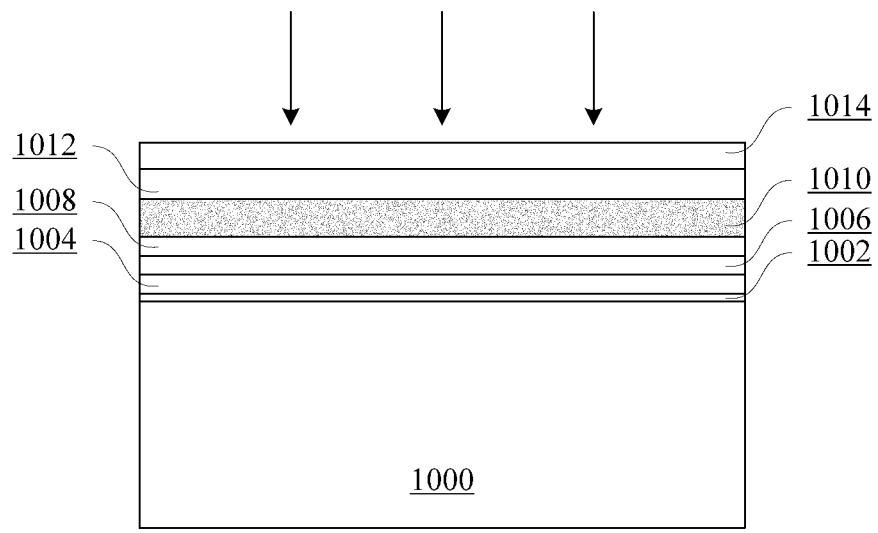
FIGS. 7-8 are simplified views schematically showing a method according to another embodiment of the present disclosure.

Further, in the above embodiments, the metal gate arrangement is shown to comprise only the metal work function layer 1010. In a further example of the present disclosure, the metal gate arrangement may further comprise other additional layer(s) to improve device performances. For example, as shown in FIG. 7, a capping layer 1006 and/or an etch stop layer 1008 may be further formed between the gate dielectric layer 1004 and the metal work function layer 1010. For example, the capping layer 1006 may comprise TiN with a thickness of about 0.5-3 nm; and the etch stop layer may comprise TaN with a thickness of about 0.5-8 nm. Typically, the capping layer 1006 and the etch stop layer 1008 are very useful in the CMOS integration process. For example, the capping layer 1006 may prevent overlying metal/metallic material(s) from diffusing into the gate dielectric layer 1004 and thereby causing problems, such as variation of the dielectric constant and increase of gate leakage. Furthermore, in the CMOS integration process for forming both NFETs and PFETs, the etch stop layer 1008 may function in etching PFET materials in an NFET region or etching NFET materials in a PFET region.

Furthermore, on top of the gate conductor layer, a barrier layer 1012 and/or a scavenging layer 1014 may be further formed. For example, the barrier layer 1012 may comprise TiN with a thickness of about 1-7 nm. The barrier layer 1012 may prevent underlying metal/metallic material(s) from diffusing upward and causing contamination. Furthermore, the scavenging layer 1014 may comprise metal, such as Ti, with a thickness of about 0.5-5 nm. The scavenging layer 1014 may reduce an Equivalent Oxide Thickness (EOT) of the gate dielectric layer by absorbing oxygen from the interface layer and the high-K gate dielectric layer and also preventing oxygen introduced by a subsequent annealing process from reacting with the interface layer and the high-K gate dielectric layer.

It is also possible to set up one or more of these additional layers as required according to the design.

In other words, in this example, the metal gate arrangement may comprise at least the metal work function layer 1010, and may optionally comprise one or more of the capping layer 1006, the etch stop layer 1008, the barrier layer 1012, or the scavenging layer 1014. In a case where the metal gate arrangement comprises multiple layers, the plasma treatment may be performed on any one or more of these multiple layers. Such plasma treatment may be performed in a manner described above with reference to FIG. 5.

For example, a layer in the metal gate arrangement can receive the plasma treatment immediately after it is formed. Alternatively, two or more layers in the metal gate arrangement can receive the plasma treatment altogether after these layers are formed. In the latter case, the power of the plasma, for example, may be controlled to allow the plasma to enter into these layers.

Figure 8:
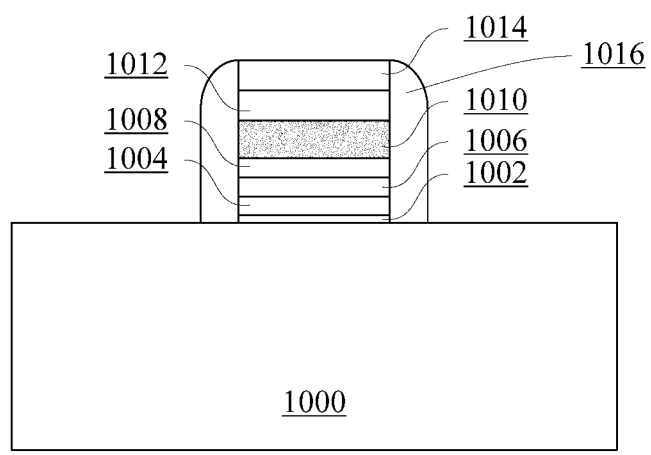

Next, as shown in FIG. 8, these layers may be patterned to form a gate stack, and the manufacture of the device may be accomplished by subsequent processes.

Here, it is to be noted that the metal gate stack arrangement described with reference to FIG. 7 and FIG. 8 is also applicable to the gate-last process.

Figure 9:
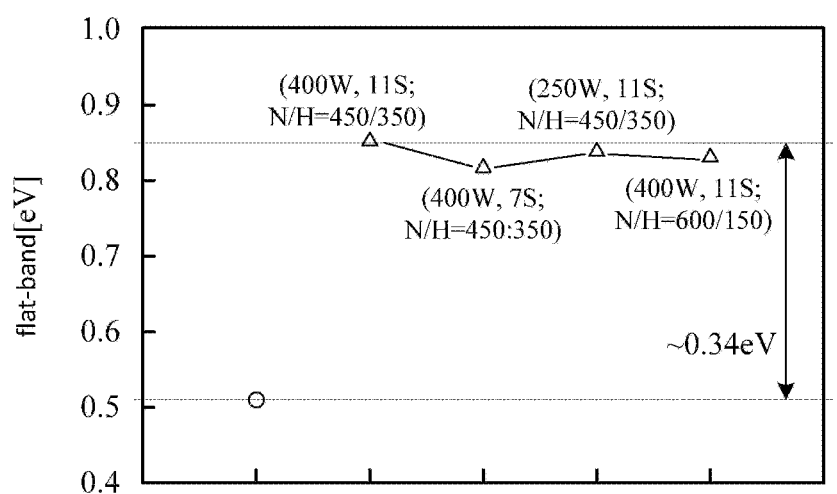
FIG. 9 is a graph showing an example test result.

In an example, a metal gate arrangement is provided to comprise a TiN metal work function layer with a thickness of about 0.5-10 nm. The metal gate arrangement is formed on a $SiO_2$ interface layer with a thickness of about 5 Å-2 nm and a $HfO_2$ gate dielectric layer with a thickness of about 10-40 Å disposed on a substrate. Furthermore, a W filling layer with a thickness of about 10-100 nm is further disposed on the metal gate arrangement. Plasma treatment is performed on the metal gate arrangement (in this example, the TiN layer). Different conditions for the plasma treatment may be selected. Here, 4 sets of conditions for the plasma treatment are selected: (1) the plasma power is about 400 W, the treatment duration is about 11 S, the atmosphere is $N_2:H_2$ at a ratio of about 450:350; (2) the plasma power is about 400 W, the treatment duration is about 7 S, the atmosphere is $N_2:H_2$ at a ratio of about 450:350; (3) the plasma power is about 250 W, the treatment duration is about 11 S, the atmosphere is $N_2:H_2$ at a ratio of about 450:350; and (4) the plasma power is about 400 W, the treatment duration is about 11 S, the atmosphere is $N_2:H_2$ at a ratio of about 600:150. Flat-band voltage test results are shown by triangular marks in FIG. 9. Furthermore, for the purpose of comparison, flat-band voltage test results for the same metal gate arrangement without the plasma treatment are shown by circular marks in FIG. 9. It can be seen that the flat band voltage is drifted at most by about 0.34 eV.

Advantageously, the technology of the present disclosure is compatible with conventional CMOS processes. Therefore, no new material or process is required to be introduced so as to achieve the adjustment of the effective work function of the metal gate. In particular, according to an example of the present disclosure, the plasma treatment may be performed on one or more layers in the metal gate arrangement, and the conditions for the plasma treatment may be selected. Furthermore, the presence/absence of the plasma treatment may also be incorporated. As a result, manufacture of devices with multiple thresholds may be achieved in a relatively easier way.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. Further, many of the elements of one embodiment may be combined with other embodiments further to or in lieu of the elements of the other embodiments. Accordingly, the technology is not limited except as by the appended claims.

We claim:

1. A method, comprising:
    forming a metal gate arrangement comprising at least a metal work function layer, and a plurality of additional layers, and
    adjusting an effective work function of the metal gate arrangement as a whole by performing plasma treatment on one or more of the plurality of additional layers in the metal gate arrangement.

2. The method according to claim 1, wherein the adjusting comprises:
    selecting conditions for the plasma treatment to achieve a desired effective work function.

3. The method according to claim 2, wherein the conditions for the plasma treatment comprise one or more of plasma power, plasma treatment duration, plasma treatment atmosphere, or plasma treatment pressure.

4. The method according to claim 3, wherein the plasma power is about 10 W to about 1000 W, the plasma treatment duration is about 1 second to about 30 minutes, the plasma treatment atmosphere comprises $N_2$:$H_2$ at a ratio of about 1:50 to about 50:1, and the plasma treatment pressure is about 1 torr to 100 torr.

5. The method according to claim 1, wherein
the plurality of additional layers further comprises a capping layer, an etch stop layer, a barrier layer, and a scavenging layer.

6. The method according to claim 1, wherein the metal gate arrangement is formed on a gate dielectric layer disposed on the substrate, and the gate dielectric layer comprises a high-K material.

7. The method according to claim 6, wherein there is an interface layer between the gate dielectric layer and the substrate.

8. The method according to claim 1, wherein a plurality of the metal gate arrangements are formed, and wherein the method further comprises:
performing the plasma treatment on some of the plurality of the metal gate arrangements, but without performing the plasma treatment on rest of the metal gate arrangements.

9. The method according to claim 1, wherein in a case where the plasma treatment is performed on multiple layers in the metal gate arrangement, the plasma treatment is applied to each of the additional layers after this layer is formed, or the plasma treatment is applied to some or all of the multiple layers altogether after they are formed.

* * * * *